United States Patent
Kozlov (10) Patent No.: US 11,848,185 B2
(45) Date of Patent: Dec. 19, 2023

(54) ELECTRODE ASSEMBLY FOR MASS SPECTROMETER

(71) Applicant: Micromass UK Limited, Wilmslow (GB)

(72) Inventor: Boris Kozlov, Manchester (GB)

(73) Assignee: Micromass UK Limited, Wilmslow (GB)

( * ) Notice: Subject to any disclaimer, the term of this patent is extended or adjusted under 35 U.S.C. 154(b) by 240 days.

(21) Appl. No.: 17/427,283

(22) PCT Filed: Jan. 29, 2020

(86) PCT No.: PCT/GB2020/050209
§ 371 (c)(1),
(2) Date: Jul. 30, 2021

(87) PCT Pub. No.: WO2020/157499
PCT Pub. Date: Aug. 6, 2020

(65) Prior Publication Data
US 2022/0115224 A1    Apr. 14, 2022

(30) Foreign Application Priority Data
Feb. 1, 2019   (GB) .................................... 1901411

(51) Int. Cl.
  *H01J 49/06*   (2006.01)
  *H01J 49/40*   (2006.01)
  *H05K 1/02*    (2006.01)

(52) U.S. Cl.
  CPC .......... *H01J 49/068* (2013.01); *H01J 49/065* (2013.01); *H01J 49/40* (2013.01); *H05K 1/0218* (2013.01)

(58) Field of Classification Search
  CPC ........ H01J 49/068; H01J 49/40; H01J 49/406; H01J 49/405; H01J 49/065; H05K 1/0218; H05K 1/144; H05K 2201/041
  USPC .................................................. 250/290, 292
  See application file for complete search history.

(56) References Cited

U.S. PATENT DOCUMENTS

| | | |
|---|---|---|
| 3,898,452 A | 8/1975 | Hertel |
| 4,390,784 A | 6/1983 | Browning et al. |
| 4,691,160 A | 9/1987 | Ino |
| 4,731,532 A | 3/1988 | Frey et al. |

(Continued)

FOREIGN PATENT DOCUMENTS

| | | |
|---|---|---|
| CA | 2412657 C | 5/2003 |
| CN | 101369510 A | 2/2009 |

(Continued)

OTHER PUBLICATIONS

International Search Report and Written Opinion for International Application No. PCT/US2016/062174 dated Mar. 6, 2017, 8 pages.

(Continued)

*Primary Examiner* — Kiet T Nguyen
(74) *Attorney, Agent, or Firm* — Goodwin Procter LLP (57) ABSTRACT

An electrode assembly, such as for an ion mirror, comprising: a first layer having a plurality of electrodes that are separated by one or more gaps; a second layer arranged to cover said one or more gaps and prevent electric fields passing through said one or more gaps, said second layer having electrically conductive material located to be coincident with said one or more gaps in the first layer.

17 Claims, 6 Drawing Sheets

(56) References Cited

U.S. PATENT DOCUMENTS

| | | |
|---|---|---|
| 4,855,595 A | 8/1989 | Blanchard |
| 5,017,780 A | 5/1991 | Kutscher et al. |
| 5,107,109 A | 4/1992 | Stafford, Jr. et al. |
| 5,128,543 A | 7/1992 | Reed et al. |
| 5,202,563 A | 4/1993 | Cotter et al. |
| 5,331,158 A | 7/1994 | Dowell |
| 5,367,162 A | 11/1994 | Holland et al. |
| 5,396,065 A | 3/1995 | Myerholtz et al. |
| 5,435,309 A | 7/1995 | Thomas et al. |
| 5,464,985 A | 11/1995 | Cornish et al. |
| 5,619,034 A | 4/1997 | Reed et al. |
| 5,654,544 A | 8/1997 | Dresch |
| 5,689,111 A | 11/1997 | Dresch et al. |
| 5,696,375 A | 12/1997 | Park et al. |
| 5,719,392 A | 2/1998 | Franzen |
| 5,763,878 A | 6/1998 | Franzen |
| 5,777,326 A | 7/1998 | Rockwood et al. |
| 5,834,771 A | 11/1998 | Yoon et al. |
| 5,955,730 A | 9/1999 | Kerley et al. |
| 5,994,695 A | 11/1999 | Young |
| 6,002,122 A | 12/1999 | Wolf |
| 6,013,913 A | 1/2000 | Hanson |
| 6,020,586 A | 2/2000 | Dresch et al. |
| 6,080,985 A | 6/2000 | Welkie et al. |
| 6,107,625 A | 8/2000 | Park |
| 6,160,256 A | 12/2000 | Ishihara |
| 6,198,096 B1 | 3/2001 | Le Cocq |
| 6,229,142 B1 | 5/2001 | Bateman et al. |
| 6,271,917 B1 | 8/2001 | Hagler |
| 6,300,626 B1 | 10/2001 | Brock et al. |
| 6,316,768 B1 | 11/2001 | Rockwood et al. |
| 6,337,482 B1 | 1/2002 | Francke |
| 6,384,410 B1 | 5/2002 | Kawato |
| 6,393,367 B1 | 5/2002 | Tang et al. |
| 6,437,325 B1 | 8/2002 | Reilly et al. |
| 6,455,845 B1 | 9/2002 | Li et al. |
| 6,469,295 B1 | 10/2002 | Park |
| 6,489,610 B1 | 12/2002 | Barofsky et al. |
| 6,504,148 B1 | 1/2003 | Hager |
| 6,504,150 B1 | 1/2003 | Verentchikov et al. |
| 6,534,764 B1 | 3/2003 | Verentchikov et al. |
| 6,545,268 B1 | 4/2003 | Verentchikov et al. |
| 6,570,152 B1 | 5/2003 | Hoyes |
| 6,576,895 B1 | 6/2003 | Park |
| 6,580,070 B2 | 6/2003 | Cornish et al. |
| 6,591,121 B1 | 7/2003 | Madarasz et al. |
| 6,607,414 B2 | 8/2003 | Charles et al. |
| 6,614,020 B2 | 9/2003 | Cornish |
| 6,627,877 B1 | 9/2003 | Davis et al. |
| 6,646,252 B1 | 11/2003 | Gonin |
| 6,647,347 B1 | 11/2003 | Roushall et al. |
| 6,664,545 B2 | 12/2003 | Kimmel et al. |
| 6,683,299 B2 | 1/2004 | Fuhrer et al. |
| 6,694,284 B1 | 2/2004 | Nikoonahad et al. |
| 6,717,132 B2 | 4/2004 | Franzen |
| 6,734,968 B1 | 5/2004 | Wang et al. |
| 6,737,642 B2 | 5/2004 | Syage et al. |
| 6,744,040 B2 | 6/2004 | Park |
| 6,744,042 B2 | 6/2004 | Zajfman et al. |
| 6,747,271 B2 | 6/2004 | Gonin et al. |
| 6,770,870 B2 | 8/2004 | Vestal |
| 6,782,342 B2 | 8/2004 | LeGore et al. |
| 6,787,760 B2 | 9/2004 | Belov et al. |
| 6,794,643 B2 | 9/2004 | Russ, IV et al. |
| 6,804,003 B1 | 10/2004 | Wang et al. |
| 6,815,673 B2 | 11/2004 | Plomley et al. |
| 6,833,544 B1 | 12/2004 | Campbell et al. |
| 6,836,742 B2 | 12/2004 | Brekenfeld |
| 6,841,936 B2 | 1/2005 | Keller et al. |
| 6,861,645 B2 | 3/2005 | Franzen |
| 6,864,479 B1 | 3/2005 | Davis et al. |
| 6,870,156 B2 | 3/2005 | Rather |
| 6,870,157 B1 | 3/2005 | Zare |
| 6,872,938 B2 | 3/2005 | Makarov et al. |
| 6,888,130 B1 | 5/2005 | Gonin |
| 6,900,431 B2 | 5/2005 | Belov et al. |
| 6,906,320 B2 | 6/2005 | Sachs et al. |
| 6,940,066 B2 | 9/2005 | Makarov et al. |
| 6,949,736 B2 | 9/2005 | Ishihara |
| 7,034,292 B1 | 4/2006 | Whitehouse et al. |
| 7,071,464 B2 | 7/2006 | Reinhold |
| 7,084,393 B2 | 8/2006 | Fuhrer et al. |
| 7,091,479 B2 | 8/2006 | Hayek |
| 7,126,114 B2 | 10/2006 | Chernushevich |
| 7,196,324 B2 | 3/2007 | Verentchikov |
| 7,217,919 B2 | 5/2007 | Boyle et al. |
| 7,221,251 B2 | 5/2007 | Menegoli et al. |
| 7,326,925 B2 | 2/2008 | Verentchikov et al. |
| 7,351,958 B2 | 4/2008 | Vestal |
| 7,365,313 B2 | 4/2008 | Fuhrer et al. |
| 7,385,187 B2 | 6/2008 | Verentchikov et al. |
| 7,388,197 B2 | 6/2008 | McLean et al. |
| 7,399,957 B2 | 7/2008 | Parker et al. |
| 7,423,259 B2 | 9/2008 | Hidalgo et al. |
| 7,498,569 B2 | 3/2009 | Ding |
| 7,501,621 B2 | 3/2009 | Willis et al. |
| 7,504,620 B2 | 3/2009 | Sato et al. |
| 7,521,671 B2 | 4/2009 | Kirihara et al. |
| 7,541,576 B2 | 6/2009 | Belov et al. |
| 7,582,864 B2 | 9/2009 | Verentchikov |
| 7,608,817 B2 | 10/2009 | Flory |
| 7,663,100 B2 | 2/2010 | Vestal |
| 7,675,031 B2 | 3/2010 | Konicek et al. |
| 7,709,789 B2 | 5/2010 | Vestal et al. |
| 7,728,289 B2 | 6/2010 | Naya et al. |
| 7,745,780 B2 | 6/2010 | McLean et al. |
| 7,755,036 B2 | 7/2010 | Satoh |
| 7,772,547 B2 | 8/2010 | Verentchikov |
| 7,800,054 B2 | 9/2010 | Fuhrer et al. |
| 7,825,373 B2 | 11/2010 | Willis et al. |
| 7,863,557 B2 | 1/2011 | Brown |
| 7,884,319 B2 | 2/2011 | Willis et al. |
| 7,932,491 B2 | 4/2011 | Vestal |
| 7,982,184 B2 | 7/2011 | Sudakov |
| 7,985,950 B2 | 7/2011 | Makarov et al. |
| 7,989,759 B2 | 8/2011 | Holle |
| 7,999,223 B2 | 8/2011 | Makarov et al. |
| 8,017,907 B2 | 9/2011 | Willis et al. |
| 8,017,909 B2 | 9/2011 | Makarov et al. |
| 8,063,360 B2 | 11/2011 | Willis et al. |
| 8,080,782 B2 | 12/2011 | Hidalgo et al. |
| 8,093,554 B2 | 1/2012 | Makarov |
| 8,237,111 B2 | 8/2012 | Golikov et al. |
| 8,354,634 B2 | 1/2013 | Green et al. |
| 8,373,120 B2 | 2/2013 | Verentchikov |
| 8,395,115 B2 | 3/2013 | Makarov et al. |
| 8,492,710 B2 | 7/2013 | Fuhrer et al. |
| 8,513,594 B2 | 8/2013 | Makarov |
| 8,633,436 B2 | 1/2014 | Ugarov |
| 8,637,815 B2 | 1/2014 | Makarov et al. |
| 8,642,948 B2 | 2/2014 | Makarov et al. |
| 8,642,951 B2 | 2/2014 | Li |
| 8,648,294 B2 | 2/2014 | Prather et al. |
| 8,653,446 B1 | 2/2014 | Mordehai et al. |
| 8,658,984 B2 | 2/2014 | Makarov et al. |
| 8,680,481 B2 | 3/2014 | Giannakopulos et al. |
| 8,723,108 B1 | 5/2014 | Ugarov |
| 8,735,818 B2 | 5/2014 | Kovtoun et al. |
| 8,772,708 B2 | 7/2014 | Kinugawa et al. |
| 8,785,845 B2 | 7/2014 | Loboda |
| 8,847,155 B2 | 9/2014 | Vestal |
| 8,853,623 B2 | 10/2014 | Verenchikov |
| 8,884,220 B2 | 11/2014 | Hoyes et al. |
| 8,921,772 B2 | 12/2014 | Verenchikov |
| 8,952,325 B2 | 2/2015 | Giles et al. |
| 8,957,369 B2 | 2/2015 | Makarov |
| 8,975,592 B2 | 3/2015 | Kobayashi et al. |
| 9,048,080 B2 | 6/2015 | Verenchikov et al. |
| 9,082,597 B2 | 7/2015 | Willis et al. |
| 9,082,604 B2 | 7/2015 | Verenchikov |
| 9,099,287 B2 | 8/2015 | Giannakopulos |
| 9,136,101 B2 | 9/2015 | Grinfeld et al. |
| 9,147,563 B2 | 9/2015 | Makarov |
| 9,196,469 B2 | 11/2015 | Makarov |

(56) References Cited

U.S. PATENT DOCUMENTS

| | | |
|---|---|---|
| 9,207,206 B2 | 12/2015 | Makarov |
| 9,214,322 B2 | 12/2015 | Kholomeev et al. |
| 9,214,328 B2 | 12/2015 | Hoyes et al. |
| 9,281,175 B2 | 3/2016 | Haufler et al. |
| 9,312,119 B2 | 4/2016 | Verenchikov |
| 9,324,544 B2 | 4/2016 | Rather |
| 9,373,490 B1 | 6/2016 | Nishiguchi et al. |
| 9,396,922 B2 | 7/2016 | Verenchikov et al. |
| 9,417,211 B2 | 8/2016 | Verenchikov |
| 9,425,034 B2 | 8/2016 | Verentchikov et al. |
| 9,472,390 B2 | 10/2016 | Verenchikov et al. |
| 9,514,922 B2 | 12/2016 | Watanabe et al. |
| 9,576,778 B2 | 2/2017 | Wang |
| 9,595,431 B2 | 3/2017 | Verenchikov |
| 9,653,273 B2 | 5/2017 | Loboda et al. |
| 9,673,033 B2 | 6/2017 | Grinfeld et al. |
| 9,679,758 B2 | 6/2017 | Grinfeld et al. |
| 9,683,963 B2 | 6/2017 | Verenchikov |
| 9,728,384 B2 | 8/2017 | Verenchikov |
| 9,779,923 B2 | 10/2017 | Verenchikov |
| 9,786,484 B2 | 10/2017 | Willis et al. |
| 9,786,485 B2 | 10/2017 | Ding et al. |
| 9,865,441 B2 | 1/2018 | Damoc et al. |
| 9,865,445 B2 | 1/2018 | Verenchikov et al. |
| 9,870,903 B2 | 1/2018 | Richardson et al. |
| 9,870,906 B1 | 1/2018 | Quarmby et al. |
| 9,881,780 B2 | 1/2018 | Verenchikov et al. |
| 9,899,201 B1 | 2/2018 | Park |
| 9,922,812 B2 | 3/2018 | Makarov |
| 9,941,107 B2 | 4/2018 | Verenchikov |
| 9,972,483 B2 | 5/2018 | Makarov |
| 10,006,892 B2 | 6/2018 | Verenchikov |
| 10,037,873 B2 | 7/2018 | Wang et al. |
| 10,141,175 B2 | 11/2018 | Verentchikov et al. |
| 10,141,176 B2 | 11/2018 | Stewart et al. |
| 10,163,616 B2 | 12/2018 | Verenchikov et al. |
| 10,186,411 B2 | 1/2019 | Makarov |
| 10,192,723 B2 | 1/2019 | Verenchikov et al. |
| 10,290,480 B2 | 5/2019 | Crowell et al. |
| 10,373,815 B2 | 8/2019 | Crowell et al. |
| 10,388,503 B2 | 8/2019 | Brown et al. |
| 10,593,525 B2 | 3/2020 | Hock et al. |
| 10,593,533 B2 | 3/2020 | Hoyes et al. |
| 10,622,203 B2 | 4/2020 | Veryovkin et al. |
| 10,629,425 B2 | 4/2020 | Hoyes et al. |
| 10,636,646 B2 | 4/2020 | Hoyes et al. |
| 2001/0011703 A1 | 8/2001 | Franzen |
| 2001/0030284 A1 | 10/2001 | Dresch et al. |
| 2002/0030159 A1 | 3/2002 | Chernushevich et al. |
| 2002/0107660 A1 | 8/2002 | Nikoonahad et al. |
| 2002/0190199 A1 | 12/2002 | Li |
| 2003/0010907 A1 | 1/2003 | Hayek et al. |
| 2003/0111597 A1 | 6/2003 | Gonin et al. |
| 2003/0232445 A1 | 12/2003 | Fulghum |
| 2004/0084613 A1 | 5/2004 | Bateman et al. |
| 2004/0108453 A1 | 6/2004 | Kobayashi et al. |
| 2004/0119012 A1 | 6/2004 | Vestal |
| 2004/0144918 A1 | 7/2004 | Zare et al. |
| 2004/0155187 A1 | 8/2004 | Axelsson |
| 2004/0159782 A1 | 8/2004 | Park |
| 2004/0183007 A1 | 9/2004 | Belov et al. |
| 2005/0006577 A1 | 1/2005 | Fuhrer et al. |
| 2005/0040326 A1 | 2/2005 | Enke |
| 2005/0103992 A1 | 5/2005 | Yamaguchi et al. |
| 2005/0133712 A1 | 6/2005 | Belov et al. |
| 2005/0151075 A1 | 7/2005 | Brown et al. |
| 2005/0194528 A1 | 9/2005 | Yamaguchi et al. |
| 2005/0242279 A1 | 11/2005 | Verentchikov |
| 2005/0258364 A1 | 11/2005 | Whitehouse et al. |
| 2006/0169882 A1 | 8/2006 | Pau et al. |
| 2006/0214100 A1 | 9/2006 | Verentchikov et al. |
| 2006/0289746 A1 | 12/2006 | Raznikov et al. |
| 2007/0023645 A1 | 2/2007 | Chernushevich |
| 2007/0029473 A1 | 2/2007 | Verenchikov |
| 2007/0176090 A1 | 8/2007 | Verentchikov |
| 2007/0187614 A1 | 8/2007 | Schneider et al. |
| 2007/0194223 A1 | 8/2007 | Sato et al. |
| 2008/0049402 A1 | 2/2008 | Han et al. |
| 2008/0197276 A1 | 8/2008 | Nishiguchi et al. |
| 2008/0203288 A1 | 8/2008 | Makarov et al. |
| 2008/0290269 A1 | 11/2008 | Saito et al. |
| 2009/0090861 A1 | 4/2009 | Willis et al. |
| 2009/0114808 A1 | 5/2009 | Bateman et al. |
| 2009/0121130 A1 | 5/2009 | Satoh |
| 2009/0206250 A1 | 8/2009 | Wollnik |
| 2009/0250607 A1 | 10/2009 | Staats et al. |
| 2009/0272890 A1 | 11/2009 | Ogawa et al. |
| 2010/0001180 A1 | 1/2010 | Bateman et al. |
| 2010/0044558 A1 | 2/2010 | Sudakov |
| 2010/0072363 A1 | 3/2010 | Giles et al. |
| 2010/0078551 A1 | 4/2010 | Loboda |
| 2010/0140469 A1 | 6/2010 | Nishiguchi |
| 2010/0193682 A1 | 8/2010 | Golikov et al. |
| 2010/0207023 A1 | 8/2010 | Loboda |
| 2010/0301202 A1 | 12/2010 | Vestal |
| 2011/0133073 A1 | 6/2011 | Sato et al. |
| 2011/0168880 A1 | 7/2011 | Ristroph et al. |
| 2011/0180702 A1 | 7/2011 | Flory et al. |
| 2011/0180705 A1 | 7/2011 | Yamaguchi |
| 2011/0186729 A1 | 8/2011 | Verentchikov et al. |
| 2012/0168618 A1 | 7/2012 | Vestal |
| 2012/0261570 A1 | 10/2012 | Shvartsburg et al. |
| 2013/0048852 A1 | 2/2013 | Verenchikov |
| 2013/0056627 A1 | 3/2013 | Verenchikov |
| 2013/0068942 A1 | 3/2013 | Verenchikov |
| 2013/0187044 A1 | 7/2013 | Ding et al. |
| 2013/0240725 A1 | 9/2013 | Makarov |
| 2013/0248702 A1 | 9/2013 | Makarov |
| 2013/0256524 A1 | 10/2013 | Brown et al. |
| 2013/0313424 A1 | 11/2013 | Makarov et al. |
| 2013/0327935 A1 | 12/2013 | Wiedenbeck |
| 2014/0054456 A1 | 2/2014 | Kinugawa et al. |
| 2014/0084156 A1 | 3/2014 | Ristroph et al. |
| 2014/0117226 A1 | 5/2014 | Giannakopulos |
| 2014/0138538 A1 | 5/2014 | Hieftje et al. |
| 2014/0183354 A1 | 7/2014 | Moon et al. |
| 2014/0191123 A1 | 7/2014 | Wildgoose et al. |
| 2014/0217275 A1 | 8/2014 | Ding |
| 2014/0239172 A1 | 8/2014 | Makarov |
| 2014/0291503 A1 | 10/2014 | Shchepunov et al. |
| 2014/0312221 A1 | 10/2014 | Verenchikov et al. |
| 2014/0361162 A1 | 12/2014 | Murray et al. |
| 2015/0028197 A1 | 1/2015 | Grinfeld et al. |
| 2015/0028198 A1 | 1/2015 | Grinfeld et al. |
| 2015/0034814 A1 | 2/2015 | Brown et al. |
| 2015/0048245 A1 | 2/2015 | Vestal et al. |
| 2015/0060656 A1 | 3/2015 | Ugarov |
| 2015/0122986 A1 | 5/2015 | Haase |
| 2015/0194296 A1 | 7/2015 | Verenchikov et al. |
| 2015/0228467 A1 | 8/2015 | Grinfeld et al. |
| 2015/0279650 A1 | 10/2015 | Verenchikov |
| 2015/2094849 | 10/2015 | Grinfeld et al. |
| 2015/0318156 A1 | 11/2015 | Loyd et al. |
| 2015/0364309 A1 | 12/2015 | Welkie |
| 2015/0380233 A1 | 12/2015 | Verenchikov |
| 2016/0005587 A1 | 1/2016 | Verenchikov |
| 2016/0035552 A1 | 2/2016 | Verenchikov |
| 2016/0035558 A1 | 2/2016 | Verenchikov et al. |
| 2016/0079052 A1 | 3/2016 | Makarov et al. |
| 2016/0225598 A1 | 8/2016 | Ristroph |
| 2016/0225602 A1 | 8/2016 | Ristroph et al. |
| 2016/0240363 A1 | 8/2016 | Verenchikov |
| 2017/0016863 A1 | 1/2017 | Verenchikov |
| 2017/0025265 A1 | 1/2017 | Verenchikov et al. |
| 2017/0032952 A1 | 2/2017 | Verenchikov |
| 2017/0098533 A1 | 4/2017 | Stewart et al. |
| 2017/0229297 A1 | 8/2017 | Green et al. |
| 2017/0338094 A1 | 11/2017 | Verenchikov et al. |
| 2018/0144921 A1 | 5/2018 | Hoyes et al. |
| 2018/0315589 A1 | 11/2018 | Oshiro |
| 2018/0366312 A1 | 12/2018 | Grinfeld et al. |
| 2019/0237318 A1 | 8/2019 | Brown |
| 2020/0083034 A1 | 3/2020 | Verenchikov et al. |
| 2020/0090919 A1 | 3/2020 | Artaev |

(56) References Cited

U.S. PATENT DOCUMENTS

| | | |
|---|---|---|
| 2020/0126781 A1 | 4/2020 | Kovtoun |
| 2020/0152440 A1 | 5/2020 | Hoyes et al. |
| 2020/0168447 A1 | 5/2020 | Verenchikov |
| 2020/0168448 A1 | 5/2020 | Verenchikov |
| 2021/0242007 A1* | 8/2021 | Verenchikov ......... H01J 49/406 |
| 2021/0249243 A1* | 8/2021 | Maher ................. G01N 27/622 |

FOREIGN PATENT DOCUMENTS

| | | |
|---|---|---|
| CN | 102131563 A | 7/2011 |
| CN | 201946564 U | 8/2011 |
| DE | 4310106 C1 | 10/1994 |
| DE | 10116536 A1 | 10/2002 |
| DE | 102015121830 A1 | 6/2017 |
| DE | 102019129108 A1 | 6/2020 |
| DE | 112015001542 B4 | 7/2020 |
| EP | 0237259 A2 | 9/1987 |
| EP | 1137044 A2 | 9/2001 |
| EP | 1566828 A2 | 8/2005 |
| EP | 1789987 A1 | 5/2007 |
| EP | 1901332 A1 | 3/2008 |
| EP | 2068346 A2 | 6/2009 |
| EP | 1665326 B1 | 4/2010 |
| EP | 1522087 B1 | 3/2011 |
| EP | 2599104 A1 | 6/2013 |
| EP | 1743354 B1 | 8/2019 |
| EP | 3662501 A1 | 6/2020 |
| EP | 3662502 A1 | 6/2020 |
| EP | 3662503 A1 | 6/2020 |
| GB | 2080021 A | 1/1982 |
| GB | 2217907 A | 11/1989 |
| GB | 2300296 A | 10/1996 |
| GB | 2390935 A | 1/2004 |
| GB | 2396742 A | 6/2004 |
| GB | 2403063 A | 12/2004 |
| GB | 2455977 A | 7/2009 |
| GB | 2476964 A | 7/2011 |
| GB | 2478300 A | 9/2011 |
| GB | 2484361 B | 4/2012 |
| GB | 2484429 B | 4/2012 |
| GB | 2485825 A | 5/2012 |
| GB | 2489094 A | 9/2012 |
| GB | 2490571 A | 11/2012 |
| GB | 2495127 A | 4/2013 |
| GB | 2495221 A | 4/2013 |
| GB | 2496991 A | 5/2013 |
| GB | 2496994 A | 5/2013 |
| GB | 2500743 A | 10/2013 |
| GB | 2501332 A | 10/2013 |
| GB | 2506362 A | 4/2014 |
| GB | 2528875 A | 2/2016 |
| GB | 2555609 A | 5/2018 |
| GB | 2556451 A | 5/2018 |
| GB | 2556830 A | 6/2018 |
| GB | 2562990 A | 12/2018 |
| GB | 2575157 A | 1/2020 |
| GB | 2575339 A | 1/2020 |
| JP | S6229049 A | 2/1987 |
| JP | 2000036285 A | 2/2000 |
| JP | 2000048764 A | 2/2000 |
| JP | 2003031178 A | 1/2003 |
| JP | 3571546 B2 | 9/2004 |
| JP | 2005538346 A | 12/2005 |
| JP | 2006049273 A | 2/2006 |
| JP | 2007227042 A | 9/2007 |
| JP | 2010062152 A | 3/2010 |
| JP | 4649234 B2 | 3/2011 |
| JP | 2011119279 A | 6/2011 |
| JP | 4806214 B2 | 11/2011 |
| JP | 2013539590 A | 10/2013 |
| JP | 5555582 B2 | 7/2014 |
| JP | 2015506567 B2 | 3/2015 |
| JP | 2015185306 A | 10/2015 |
| RU | 2564443 C2 | 10/2015 |
| RU | 2015148627 A | 5/2017 |
| SU | 198034 | 6/1967 |
| SU | 1681340 A1 | 9/1991 |
| SU | 1725289 A1 | 4/1992 |
| WO | 9103071 A1 | 3/1991 |
| WO | 1998001218 | 1/1998 |
| WO | 1998008244 A2 | 2/1998 |
| WO | 200077823 A2 | 12/2000 |
| WO | 2005001878 A2 | 1/2005 |
| WO | 2006014984 A1 | 2/2006 |
| WO | 2006049623 A2 | 5/2006 |
| WO | 2006102430 A2 | 9/2006 |
| WO | 2006103448 A2 | 10/2006 |
| WO | 2007044696 A1 | 4/2007 |
| WO | 2007104992 A2 | 9/2007 |
| WO | 2007136373 A1 | 11/2007 |
| WO | 2008046594 A2 | 4/2008 |
| WO | 2008087389 A2 | 7/2008 |
| WO | 2010008386 A1 | 1/2010 |
| WO | 2010138781 A2 | 12/2010 |
| WO | 2011086430 A1 | 7/2011 |
| WO | 2011107836 A2 | 9/2011 |
| WO | 2011135477 A1 | 11/2011 |
| WO | 2012010894 A1 | 1/2012 |
| WO | 2012013354 A1 | 2/2012 |
| WO | 2012023031 A2 | 2/2012 |
| WO | 2012024468 A2 | 2/2012 |
| WO | 2012024570 A2 | 2/2012 |
| WO | 2012116765 A1 | 9/2012 |
| WO | 2013045428 A1 | 4/2013 |
| WO | 2013063587 A2 | 5/2013 |
| WO | 2013067366 A2 | 5/2013 |
| WO | 2013098612 A1 | 7/2013 |
| WO | 2013110587 A | 8/2013 |
| WO | 2013110588 A2 | 8/2013 |
| WO | 2013124207 A | 8/2013 |
| WO | 2014021960 A1 | 2/2014 |
| WO | 2014074822 A1 | 5/2014 |
| WO | 2014110697 A | 7/2014 |
| WO | 2014142897 A1 | 9/2014 |
| WO | 2014152902 A2 | 9/2014 |
| WO | 2015142897 A1 | 9/2015 |
| WO | 2015152968 A1 | 10/2015 |
| WO | 2015153622 A1 | 10/2015 |
| WO | 2015153630 A1 | 10/2015 |
| WO | 2015153644 A1 | 10/2015 |
| WO | 2015175988 A1 | 11/2015 |
| WO | 2016064398 A1 | 4/2016 |
| WO | 2016174462 A1 | 11/2016 |
| WO | 2017042665 A1 | 3/2017 |
| WO | 2018073589 A1 | 4/2018 |
| WO | 2018109920 A1 | 6/2018 |
| WO | 2018124861 A2 | 7/2018 |
| WO | 2018183201 A1 | 10/2018 |
| WO | 2019030472 A1 | 2/2019 |
| WO | 2019030474 A1 | 2/2019 |
| WO | 2019030475 A1 | 2/2019 |
| WO | 2019030476 A1 | 2/2019 |
| WO | 2019030477 A1 | 2/2019 |
| WO | 2019058226 A1 | 3/2019 |
| WO | 2019162687 A1 | 8/2019 |
| WO | 2019202338 A1 | 10/2019 |
| WO | 2019229599 A1 | 12/2019 |
| WO | 2020002940 A1 | 1/2020 |
| WO | 2020021255 A1 | 1/2020 |
| WO | 2020121167 A1 | 6/2020 |
| WO | 2020121168 A1 | 6/2020 |

OTHER PUBLICATIONS

IPRP PCT/US2016/062174 dated May 22, 2018, 6 pages.
Search Report for GB Application No. GB1520130.4 dated May 25, 2016.
International Search Report and Written Opinion for International Application No. PCT/US2016/062203 dated Mar. 6, 2017, 8 pages.
IPRP PCT/US2016/062203, dated May 22, 2018, 6 pages.
Search Report for GB Application No. GB1520134.6 dated May 26, 2016.

(56) References Cited

OTHER PUBLICATIONS

Search Report Under Section 17(5) for Application No. GB1507363.8 dated Nov. 9, 2015.
International Search Report and Written Opinion of the International Search Authority for Application No. PCT/GB2016/051238 dated Jul. 12, 2016, 16 pages.
IPRP for application PCT/GB2016/051238 dated Oct. 31, 2017, 13 pages.
International Search Report and Written Opinion for International Application No. PCT/US2016/063076 dated Mar. 30, 2017, 9 pages.
IPRP for application PCT/US2016/063076, dated May 29, 2018, 7 pages.
Search Report for GB Application No. 1520540.4 dated May 24, 2016.
IPRP PCT/GB17/51981 dated Jan. 8, 2019, 7 pages.
IPRP for International application No. PCT/GB2018/051206, dated Nov. 5, 2019, 7 pages.
International Search Report and Written Opinion for International Application No. PCT/GB2018/051206, dated Jul. 12, 2018, 9 pages.
Examination Report under Section 18(3) for Application No. GB1906258.7, dated May 5, 2021, 4 pages.
Author unknown, "Electrostatic lens ," Wikipedia, Mar. 31, 2017 (Mar. 31, 2017), XP055518392, Retrieved from the Internet:URL: https://en.wikipedia.org/w/index.php?title=Electrostatic_lens&oldid=773161674 [retrieved on Oct. 24, 2018].
Hussein, O.A. et al., "Study the most favorable shapes of electrostatic quadrupole doublet lenses" , AIP Conference Proceedings, vol. 1815, Feb. 17, 2017 (Feb. 17, 2017), p. 110003.
Guan S., et al. "Stacked-ring electrostatic ion guide" Journal of the American Society for Mass Spectrometry, Elsevier Science Inc, 7(1):101-106 (1996). Abstract.
International Search Report and Written Opinion for application No. PCT/GB2018/052104, dated Oct. 31, 2018, 14 pages.
International Search Report and Written Opinion for application No. PCT/GB2018/052105, dated Oct. 15, 2018, 18 pages.
International Search Report and Written Opinion for application PCT/GB2018/052100, dated Oct. 19, 2018, 19 pages.
International Search Report and Written Opinion for application PCT/GB2018/052102, dated Oct. 25, 2018, 14 pages.
International Search Report and Written Opinion for application No. PCT/GB2018/052099, dated Oct. 10, 2018, 16 pages.
International Search Report and Written Opinion for application No. PCT/GB2018/052101, dated Oct. 19, 2018, 15 pages.
Combined Search and Examination Report under Sections 17 and 18(3) for application GB1807605.9 dated Oct. 29, 2018, 5 pages.
Combined Search and Examination Report under Sections 17 and 18(3) for application GB1807626.5, dated Oct. 29, 2018, 7 pages.
Yavor, M.I., et al., "High performance gridless ion mirrors for multi-reflection time-of-flight and electrostatic trap mass analyzers", International Journal of Mass Spectrometry, vol. 426, Mar. 2018, pp. 1-11.
Search Report under Section 17(5) for application GB1707208.3, dated Oct. 12, 2017, 5 pages.
Communication Relating to the Results of the Partial International Search for International Application No. PCT/GB2019/01118, dated Jul. 19, 2019, 25 pages.
Doroshenko, V.M., and Cotter, R.J., "Ideal velocity focusing in a reflectron time-of-flight mass spectrometer", American Society for Mass Spectrometry, 10(10):992-999 (1999).
Kozlov, B. et al. "Enhanced Mass Accuracy in Multi-Reflecting TOF MS" www.waters.com/posters, ASMS Conference (2017).
Kozlov, B. et al. "Multiplexed Operation of an Orthogonal Multi-Reflecting TOF Instrument to Increase Duty Cycle by Two Orders" ASMS Conference, San Diego, CA, Jun. 6, 2018.
Kozlov, B. et al. "High accuracy self-calibration method for high resolution mass spectra" ASMS Conference Abstract, 2019.
Kozlov, B. et al. "Fast Ion Mobility Spectrometry and High Resolution TOF MS" ASMS Conference Poster (2014).
Verenchicov., A. N. "Parallel MS-MS Analysis in a Time-Flight Tandem. Problem Statement, Method, and Instrucmental Schemes" Institute for Analytical Instrucmentation RAS, Saint-Petersburg, (2004) Abstract.
Yavor, M. I. "Planar Multireflection Time-of-Flight Mass Analyser with Unlimited Mass Range" Institute for Analytical Instrucmentation RAS, Saint-Petersburg, (2004) Abstract.
Khasin, Y. I. et al. "Initial Experimenatl Studies of a Planar Multireflection Time-of-Flight Mass Spectrometer" Institute for Analytical Instrucmentation RAS, Saint-Petersburg, (2004) Abstract.
Verenchicov., A. N. et al. "Stability of Ion Motion in Periodic Electrostatic Fields" Institute for Analytical Instrucmentation RAS, Saint-Petersburg, (2004) Abstract.
Verenchicov., A. N. "The Concept of Multireflecting Mass Spectrometer for Continuous Ion Sources" Institute for Analytical Instrucmentation RAS, Saint-Petersburg, (2006) Abstract.
Verenchicov., A. N., et al. "Accurate Mass Measurements for Inerpreting Spectra of atmospheric Pressure Ionization" Institute for Analytical Instrucmentation RAS, Saint-Petersburg, (2006) Abstract.
Kozlov, B. N. et al., "Experimental Studies of Space Charge Effects in Multireflecting Time-of-Flight Mass Spectrometes" Institute for Analytical Instrucmentation RAS, Saint-Petersburg, (2006) Abstract.
Kozlov, B. N. et al., "Multireflecting Time-of-Flight Mass Spectrometer With an Ion Trap Source" Institute for Analytical Instrucmentation RAS, Saint-Petersburg, (2006) Abstract.
Hasin, Y. I., et al., "Planar Time-of-Flight Multireflecting Mass Spectrometer with an Orthogonal Ion Injection Out of Continuous Ion Sources" Institute for Analytical Instrucmentation RAS, Saint-Petersburg, (2006) Abstract.
Lutvinsky Y. I. et al., "Estimation of Capacity of High Resolution Mass Spectra for Analysis of Complex Mixtures" Institute for Analytical Instrucmentation RAS, Saint-Petersburg, (2006) Abstract.
Verenchicov., A. N. et al. "Multiplexing in Multi-Reflecting TOF MS" Journal of Applied Solution Chemistry and Modeling, 6:1-22 (2017).
Supplementary Partial EP Search Report for EP Application No. 16869126.9, dated Jun. 13, 2019.
Supplementary Partial EP Search Report for EP Application No. 16866997.6, dated Jun. 7, 2019.
"Reflectron—Wikipedia", Oct. 9, 2015, Retrieved from the Internet: URL:https://en.wikipedia.org/w/index.php?title=Reflectron&oldid=684843442 [retrieved on May 29, 2019].
Scherer, S., et al., "A novel principle for an ion mirror design in time-of-flight mass spectrometry", International Journal of Mass Spectrometry, Elsevier Science Publishers, Amsterdam, NL, vol. 251, No. 1, Mar. 15, 2006.
Combined Search and Examination Report under Sections 17 and 18(3) for Application No. GB2001232.4, dated Jul. 1, 2020, 5 pages.
Combined Search and Examination Report under Sections 17 and 18(3), for Application No. GB1901411.7, dated Jul. 31, 2019, 7 pages.
Deng, L., et al., "Serpentine Ultralong Path with Extended Routing (SUPER) High Resolution Traveling Wave Ion Mobility-MS using Structures for Lossless Ion Manipulations", Anal Chem 89(8): 4628-4634 (2017).
Deng, L., et al., "Compression Ratio Ion Mobility Programming (CRIMP) Accumulation and Compression of Billions of Ions for Ion Mobility-Mass Spectrometry Using Traveling Waves in Structures for Lossless Ion Manipulations (SLIM)", Anal Chem 89(12):6432-6439 (2017).
International Search Report and Written Opinion for International Application No. PCT/EP2017/070508 dated Oct. 16, 2017, 17 pages.
Search Report for United Kingdom Application No. GB1613988.3 dated Jan. 5, 2017, 4 pages.
Sakurai et al., "A New Multi-Passage Time-of-Flight Mass Spectrometer at JAIST", Nuclear Instruments & Methods in Physics Research, Section A, Elsevier, 427(1-2): 182-186, May 11, 1999. Abstract.
Toyoda et al., "Multi-Turn-Time-of-Flight Mass Spectometers with Electrostatic Sectors", Journal of Mass Spectrometry, 38: 1125-1142, Jan. 1, 2003.

(56) References Cited

OTHER PUBLICATIONS

Wouters et al., "Optical Design of the TOFI (Time-of-Flight Isochronous) Spectrometer for Mass Measurements of Exotic Nuclei", Nuclear Instruments and Methods in Physics Research, Section A, 240(1): 77-90, Oct. 1, 1985.
Stresau, D., et al.: "Ion Counting Beyond 10ghz Using a New Detector and Conventional Electronics", European Winter Conference on Plasma Spectrochemistry, Feb. 4-8, 2001, Lillehammer, Norway, Retrieved from the Internet:www.etp-ms.com/file-repository/21 [retrieved on Jul. 31, 2019].
Kaufmann, R., et. al., "Sequencing of peptides in a time-of-flight mass spectrometer:evaluation of postsource decay following matrix-assisted laser desorption ionisation (MALDI)", International Journal of Mass Spectrometry and Ion Processes, Elsevier Scientific Publishing Co. Amsterdam, NL, 131:355-385, Feb. 24, 1994.
Barry Shaulis et al: "Signal linearity of an extended range pulse counting detector: Applications to accurate and precise U-Pb dating of zircon by laser ablation quadrupole ICP-MS", G3: Geochemistry, Geophysics, Geosystems, 11(11):1-12, Nov. 20, 2010.
Search Report for United Kingdom Application No. GB1708430.2 dated Nov. 28, 2017.
International Search Report and Written Opinion for International Application No. PCT/GB2018/051320 dated Aug. 1, 2018.
International Search Report and Written Opinion for International Application No. PCT/GB2019/051839 dated Sep. 18, 2019.
International Search Report and Written Opinion for International Application No. PCT/GB2019/051234 dated Jul. 29, 2019, 5 pages.
Combined Search and Examination Report for United Kingdom Application No. GB1901411.7 dated Jul. 31, 2019.
Extended European Search Report for EP Patent Application No. 16866997.6, dated Oct. 16, 2019.
Combined Search and Examination Report for GB 1906258.7, dated Oct. 25, 2019.
Combined Search and Examination Report for GB1906253.8, dated Oct. 30, 2019, 5 pages.
Search Report under Section 17(5) for GB1916445.8, dated Jun. 15, 2020.
International Search Report and Written Opinion for International application No. PCT/GB2020/050209, dated Apr. 28, 2020, 12 pages.
Author unknown, "Einzel Lens", Wikipedia [online] Nov. 2020 [retrieved on Nov. 3, 2020]. Retrieved from Internet URL: https://en.wikipedia.org/wiki/Einzel_lens, 2 pages.
International Search Report and Written Opinion for International application No. PCT/GB2019/051235, dated Sep. 25, 2019, 22 pages.
International Search Report and Written Opinion for International application No. PCT/GB2019/051416, dated Oct. 10, 2019, 22 pages.
Search and Examination Report under Sections 17 and 18(3) for Application No. GB1906258.7, dated Dec. 11, 2020, 7 pages.
Carey, D.C., "Why a second-order magnetic optical achromat works", Nucl. Instrum. Meth., 189(203):365-367 (1981).
Yavor, M., "Optics of Charged Particle Analyzers", Advances in Imaging and Electron Physics Book Series, vol. 57 (2009) Abstract.
Sakurai, T. et al., "Ion optics for time-of-flight mass spectrometers with multiple symmetry", Int J Mass Spectrom Ion Proc 63(2-3):273-287 (1985).
Wollnik, H., "Optics of Charged Particles", Acad. Press, Orlando, FL (1987) Abstract.
Wollnik, H., and Casares, A., "An energy-isochronous multi-pass time-of-flight mass spectrometer consisting of two coaxial electrostatic mirrors", Int J Mass Spectrom 227:217-222 (2003).
O'Halloran, G.J., et al., "Determination of Chemical Species Prevalent in a Plasma Jet", Bendix Corp Report ASD-TDR-62-644, U.S. Air Force (1964). Abstract.
Examination Report for United Kingdom Application No. GB1618980.5 dated Jul. 25, 2019.
Communication pursuant to Article 94(3) EPC for Application No. 16867005.7, dated Jul. 1, 2021, 6 pages.

\* cited by examiner

ELECTRODE ASSEMBLY FOR MASS SPECTROMETER

CROSS-REFERENCE TO RELATED APPLICATIONS

This application is a U.S. national phase filing claiming the benefit of and priority to International Patent Application No. PCT/GB2020/050209, filed Jan. 29, 2020, which claims priority from and the benefit of United Kingdom patent application No. 1901411.7 filed on Feb. 1, 2019. The entire contents of these applications are incorporated herein by reference.

FIELD OF THE INVENTION

The present invention relates generally to an electrode assembly for generating electrical fields to manipulate charged particles, such as ions, and to corresponding methods of using such an electrode assembly to manipulate charged particles. Embodiments of the present disclosure include mass or mobility spectrometers comprising the electrode assembly, and corresponding methods of mass or mobility spectrometry.

BACKGROUND

In order to provide miniaturized and/or accurate instruments, it is necessary to provide ion optical devices having relatively small and/or precise electrode structures. Technologies such as Micro-Electro-Mechanical Systems (MEMS) and printed circuit boards have been used to achieve this.

Printed circuit boards (PCBs) having an electrically insulating substrate and electrodes deposited thereon have previously been used to form electrode structures in mass spectrometry, e.g. see U.S. Pat. No. 6,607,414. However, charged particles such as ions impact on the insulating substrate in the areas between the electrodes, causing those areas to become electrically charged and hence affecting the electrical potential profile in the vicinity of those areas. In order to avoid this problem, it is known to cut out the insulating substrate in the areas between the electrodes so as to form gaps, so that electrical charge cannot build up in these areas. However, external electrical fields are then able to penetrate through such gaps and into the ion optical device, which is generally undesirable. In order to mitigate this, the width of the gap can be made relatively small, as compared to the depth of the gap in the direction through the substrate. It is desirable to make the width of the gap 2.5 to 3 times smaller than the depth of the gap. However, the depth of the gap is set by the thickness of the insulating substrate and is relatively small. It is not always possible to make the width of the gap 2.5 to 3 times smaller than this, for example, as the potential difference between electrodes on the PCB either side of the gap can be high and doing so may lead to electrical breakdown and arcing between the electrodes.

Another known approach is to provide grooves in the substrate surface such that the charged particles enter into the groves, rather than charge building up on the outer surface, such as in U.S. Pat. No. 9,653,273. As the groove does not extend entirely through the substrate this technique prevents external electric fields penetrating into the ion-optical device. However, in order to function well, the depth of the groove is required to be relatively large as compared to its width. For example, it is desirable for the depth of the groove to exceed its width by factor of three or more. However, as the depth of the groove is limited by the thickness of the substrate, the width of the groove and hence the spacing between electrodes on the PCB is also limited to being relatively small. This again places limitations on the voltages that can be applied to the electrodes either side of the groove.

Another known approach is to coat the spaces between the electrodes with a resistive layer that transfers charge to the electrodes, as described in Austin et al JASMS 19, 1435-1441, 2008. However, it is difficult to support the desired electric field accuracy when using such resistive coatings. Also, only moderate electric fields are able to be used with such techniques so as to avoid surface discharges.

SUMMARY

The present invention provides an electrode assembly comprising:
  a first layer having a plurality of electrodes that are separated by one or more gaps;
  at least one second layer arranged to cover said one or more gaps and prevent electric fields passing through said one or more gaps, said at least one second layer having electrically conductive material located to be coincident with said one or more gaps in the first layer.

As gaps are provided between the electrodes of the first layer, any charged particles, such as ions, that are directed towards the first layer either impact on the electrodes or pass through the gaps between the electrodes. As such, unwanted electrical charge is unable to build up on the inner surface of the first layer and does not affect the electric field generated by the electrodes of the first layer. The second layer prevents electric fields passing through the gaps, in either direction, which may be undesirable. The conductive material of the second layer may also prevent unwanted electrical charge from building up and affecting the electric field generated by the electrodes of the first layer.

The conductive material of the second layer may overlay the one or more gaps in the first layer.

Optionally, no solid material is provided in the gaps in the first layer.

The plurality of electrodes may be elongated electrodes and the gaps may be elongated slots.

The first layer may comprise only electrode material, such as spaced apart electrodes.

Alternatively, the first layer may comprise a printed circuit board (PCB) having an electrically insulating substrate, wherein said plurality of electrodes are deposited on, etched on, printed on, laminated to, or otherwise formed on said substrate; and wherein the substrate may have one or more apertures therethrough that are respectively coincident with said one or more gaps.

Relative to machined electrodes, PCBs allow the production of finer, more accurate features. For example, in the context of the electrode assembly being used in an ion mirror, the electrode assembly is able to produce relatively high ion focusing at the edge of the mirror.

The PCB substrate may be made of a vacuum-compatible material such as ceramic.

As the substrate includes one or more apertures coincident with said one or more gaps, charged particles that enter the gaps are able to pass through the substrate and away from the first layer.

The electrodes of the first layer may extend so as to cover side edges of the apertures in the substrate.

A single said second layer may cover multiple gaps, or all gaps, in the first layer.

A separate one of said second layers may cover each gap in the first layer.

The at least one second layer may comprise a printed circuit board (PCB) having an electrically insulating substrate, wherein said electrically conductive material is deposited on, etched on, printed on, laminated to, or otherwise formed on said substrate.

The use of PCBs for the first and second layers (and any intermediate layers), allows manufacturing ease, low cost, and allows electrode layers to be accurately aligned easily.

The first layer may be a plurality of spaced apart sheet metal or plate metal electrodes; and/or said second layer may be at least one sheet metal or plate metal electrode.

The electrically conductive material may be at least on the side of the second layer facing towards the first layer.

This may be used to prevent charge building up on the second layer that may otherwise affect the electric fields from the plurality of electrodes on the first layer.

Alternatively, the electrically conductive material may be on the side of the second layer facing away from the first layer, which may be arranged to prevent electric fields passing through the gap. It is also contemplated that the entirety of the second layer may be conductive.

The conductive material may be electrically grounded or connected to a voltage source so as to be maintained at an electrical potential, in use.

The first layer may comprise first and second electrodes on opposite sides of each gap in the first layer and that are connected to voltage sources so as to be maintained at different electrical potentials in use, and the conductive material in the second layer at a location coinciding with that gap may be connected to a voltage source so as to be maintained at an electrical potential between said different electrical potentials, in use.

The conductive material may be connected to a voltage source so as to be maintained at an electrical potential substantially midway between said different electrical potentials, in use.

The electrode assembly may comprise at least one intermediate layer arranged between the first and second layers for spacing the first layer away from the at least one second layer; optionally wherein the at least one intermediate layer is a PCB.

The first, second and intermediate layers may be substantially parallel and may each be substantially planar.

The at least one intermediate layer may be at least one electrically insulating layer.

If the at least one intermediate layer is a PCB layer, it may comprise conductive material on one or more of its surfaces or may only be the PCB substrate material.

Each of the at least one intermediate layers may comprise a plurality of apertures therein, wherein each aperture is located to be coincident with both one of the gaps in the first layer and the conductive material on the second layer.

The apertures may be slotted apertures.

Each of the at least one intermediate layer may comprise a plurality of ribs between the apertures. The ribs may be located to be coincident with the electrodes in the first layer, and optionally between the spaced apart conductive material on the second layer.

The first layer, second layer, and any intermediate layer(s) present may be adhered or otherwise joined together to provide a composite layered structure. This composite layered structure may be adhered or otherwise joined to a rigid support, for example, to provide the composite layered structure an accurate shape and/or flatness.

The first layer and/or second layer (and/or any intermediate layers present) may be formed by 3D printing.

One or more electrical components, such as resistors or capacitors etc., may connect the electrodes in the first layer or the electrodes in the second layer (or any electrodes in any intermediate layers present). For example, one or more electrical components, such as resistors may connect the electrodes on either side of each gap in the first layer. The electrodes in the first layer may be connected to each other by such electrical components such that, when connected to a voltage supply, these electrodes generate the desired electrical field (e.g. an ion reflecting field when the electrode assembly is used in an ion mirror). Additionally, or alternatively, the electrodes in the second layer may be connected to each other by resistors.

The electrode assembly may comprise a gas conduit from the outside of the second layer to the one or more gaps in the first layer, for pumping gas from the gaps to the outside of the second layer. Embodiments may therefore include a gas pump arranged to perform such gas pumping. This, for example, enables the electrode assembly to be used in an ion-optical device that is required to be evacuated.

The second layer (and any intermediate layers that may be present) may comprise apertures in fluid communication with the gaps in the first layer, so that gas can be pumped through the apertures and out to the outside of the second layer.

The present invention also provides an ion-optical element comprising:
  a first electrode assembly of the form described hereinabove; and
  a second electrode assembly of the form described hereinabove;
  wherein the first and second electrode assemblies are spaced apart so as to define an ion receiving region therebetween.

The first and second electrode assemblies may be planar and/or parallel to each other.

The first layer of the first electrode assembly may face the first layer of the second electrode assembly.

The ion-optical element may be an ion mirror comprising voltage supplies connected to the plurality of electrodes in each of the first and second electrode assemblies for applying different voltages to these electrode for reflecting ions within the ion mirror. Alternatively, the ion-optical element may be an ion lens, ion deflector, ion reflector, ion accelerator, orthogonal ion accelerator or ion detector.

The first and second electrode assemblies may be connected to each other by one or more additional electrode or insulator layer. All of the layers in such an assembly may be PCB layer, for example, so as to for a hollow multilayer PCB device. For example, the ion optical device may be an ion mass or mobility analyzer and the whole analyzer (optionally except for any ion detector present) may be formed from a multilayer PCB structure.

The ion-optical element may comprise one or more metal electrode extending between and/or joined to the first and second electrode assemblies.

The one or more metal electrode may be a sheet metal or plate metal electrode.

The present invention also provides a Time of Flight (TOF) mass analyzer, multi-reflecting TOF mass analyzer, electrostatic trap, mass spectrometer or mobility spectrometer comprising an electrode assembly or ion-optical element as described hereinabove.

In less preferred embodiments it is contemplated that the at least one second layer does not have electrically conductive material located to be coincident with said one or more gaps in the first layer.

Accordingly, from a second aspect the present invention provides an electrode assembly comprising:

a first layer having a plurality of electrodes that are separated by one or more gaps; and at least one second layer arranged and configured to cover said one or more gaps and prevent electric fields passing through said one or more gaps.

BRIEF DESCRIPTION OF THE DRAWINGS

Various embodiments will now be described, by way of example only, and with reference to the accompanying drawings in which.

DETAILED DESCRIPTION

Although the present invention may be used to form electrode structures in any ion-optical device, such as for or in a mass spectrometer or ion mobility spectrometer, embodiments will now be described in which the electrode structures form part of a Time of Flight (TOF) mass analyzer. In particular, embodiments will now be described in which the electrode structures form part of a Multi-Reflecting Time of Flight (MRTOF) mass analyzer.

Figure 1A:
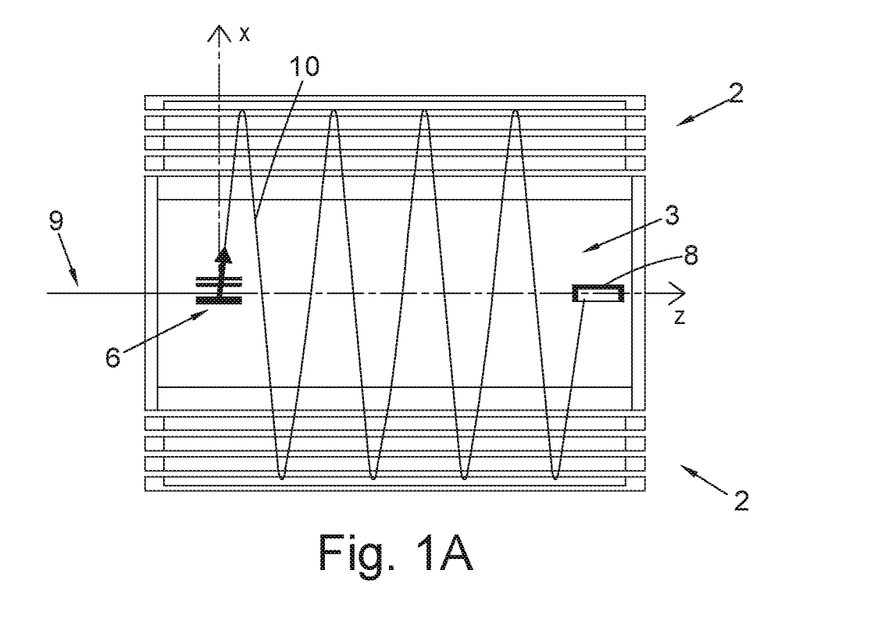
FIGS. 1A and 1B show schematics of MRTOF mass analyzers according to embodiments of the present invention.

FIG. 1A shows a schematic of an MRTOF mass analyzer according to an embodiment of the present invention. The instrument comprises two gridless ion mirrors 2 that are separated in the X-dimension by a field-free region 3. Each ion mirror 2 comprises multiple electrodes arranged so that different voltages may be applied to the different electrodes to cause the ions to be reflected in the X-dimension. The electrodes are elongated in the Z-dimension, which allows the ions to be reflected multiple times by each mirror 2 as they pass through the device, as will be described in more detail below. Each ion mirror 2 may form a two-dimensional electrostatic field in the X-Y plane. The drift space 3 arranged between the ion mirrors 2 may be substantially electric field-free such that when the ions are reflected and travel in the space between the ion mirrors 2 they travel through a substantially field-free region 3. An ion accelerator 6, such as an orthogonal accelerator for example, may be arranged at one end of the mass analyzer (in the Z-dimension) and an ion detector 8 may be arranged at the other end of the analyzer.

In embodiments, an ion source delivers ions 9 along the Z-dimension to the orthogonal ion accelerator 6, which pulses packets of ions 10 towards a first of the ion mirrors.

The ions therefore have a velocity in the X-dimension and also a drift velocity in the Z-dimension. The ions enter into the first ion mirror and are reflected back towards the second of the ion mirrors. The ions pass through the field-free region 3 between the mirrors 2 as they travel towards the second ion mirror and they separate according to their mass to charge ratios in the known manner that occurs in field-free regions. The ions then enter the second mirror and are reflected back to the first ion mirror, again passing through the field-free region 3 between the mirrors as they travel towards the first ion mirror. The first ion mirror then reflects the ions back to the second ion mirror. This continues and the ions are continually reflected between the two ion mirrors 2 as they drift along the device in the Z-dimension until the ions impact upon ion detector 8. The ions therefore follow a substantially sinusoidal mean trajectory within the X-Z plane between the orthogonal accelerator and the ion detector 8.

The MRTOF mass analyzer may use the duration of time that has elapsed between a given ion being pulsed from the orthogonal accelerator 6 to the time at which that ion is detected, along with the knowledge of its flight path length, to calculate the mass to charge ratio of that ion.

Figure 1B:
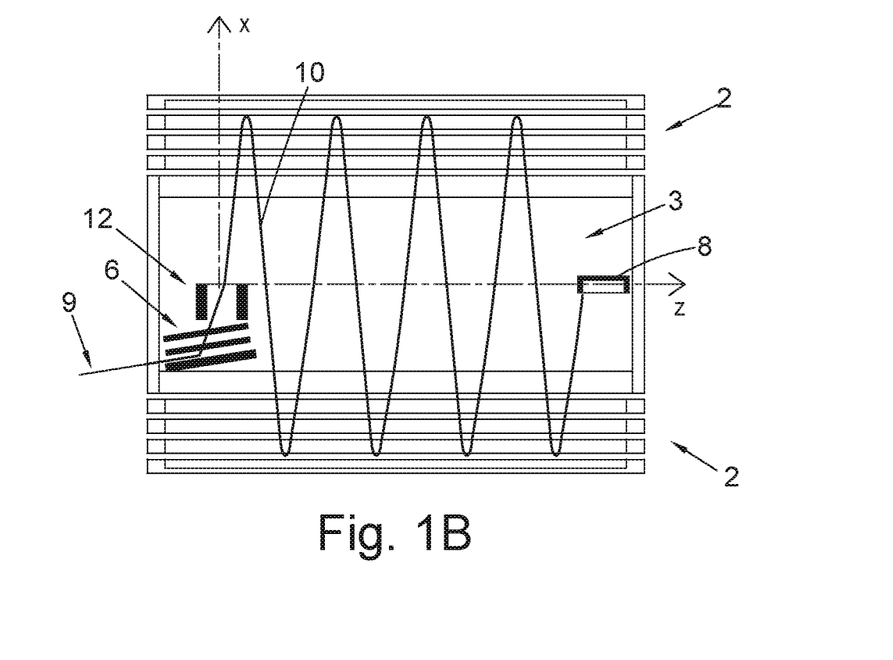

FIG. 1B shows a schematic of an MRTOF mass analyzer according to another embodiment of the present invention. This embodiment is the same as that shown in FIG. 1A, except that the ion receiving axis of the orthogonal accelerator 6 is tilted with respect to the Z-dimension. Additionally, or alternatively, an ion deflector 12 is provided for deflecting the ions that have been pulsed by the orthogonal accelerator 6 in the Z-dimension. This deflector 12 reduces the velocity of the ions in the Z-dimension and hence increases the number of ion mirror reflections before the ions impact on the detector 8. The deflector 12 may be arranged so as to deflect ions at the exit of the orthogonal accelerator 6, before the ions have passed into any ion mirrors 2.

In order for such MRTOF instruments to attain high mass resolution and mass accuracy it is important that the electrodes of the ion mirrors 2 are formed and aligned to a relatively high precision. Conventionally, ion mirrors in TOF mass analyzers are assembled using bulk metal plate electrodes. For relatively high quality MRTOF ion mirrors that can focus ions having a relatively wide spread of kinetic energies, it is advantageous to provide precisely positioned and relatively narrow electrodes in the vicinity of ion reflection area. For example, some electrodes may be required to be only as wide as 2-3 mm in the X-dimension. The electrodes may be elongated in the drift (Z-) dimension and may need to have high parallelism in the drift (Z-) dimension, such as to a higher accuracy than 50 microns. Such electrode structures are difficult to provide using conventional mechanical treatments of bulk metal or using sheet metals. For example, conventional ion mirror electrodes are made of stacked parallel plate electrodes, each of which has a large aperture therein to form the ion reflecting path through it. The stacked plates are separated by spacers formed from electrically insulating material. However, it is difficult to make the electrodes precisely flat unless they are relatively thick. Also, the insulators between the plates need to be relatively far from the ion inlet to the mirror interior so as to prevent electric fields penetrating through the regions between the plates, and also to minimize spurious electric fields that would otherwise be caused by ions impacting on and electrically charging the insulating spacers. This renders the ion mirror assembly relatively large and heavy.

Embodiments of the present invention may use a printed circuit board (PCB) to provide multiple electrodes of an ion-optical device. The PCB may be slotted or otherwise apertured the entire way therethrough so as to provide a gap between different electrodes. A layer may be provided behind that gap in the PCB so as to prevent electric fields passing through the gap. The layer is desirably spaced apart from the apertured PCB, although it is contemplated that it may be directly adjacent to it. The layer may be a conductive sheet, Alternatively the layer may be a conductive material coated on the surface of a substrate that faces the electrodes of the PCB, the coating being at least in the regions coinciding with the gaps in the apertured PCB. The conductive sheet or material coinciding with any given gap may be grounded or another electrical potential applied thereto, such as a potential intermediate the potentials of the electrodes on either side of the gap. This prevents charge building up on the layer and affecting the electric field inside the ion-optical device.

Figure 2:
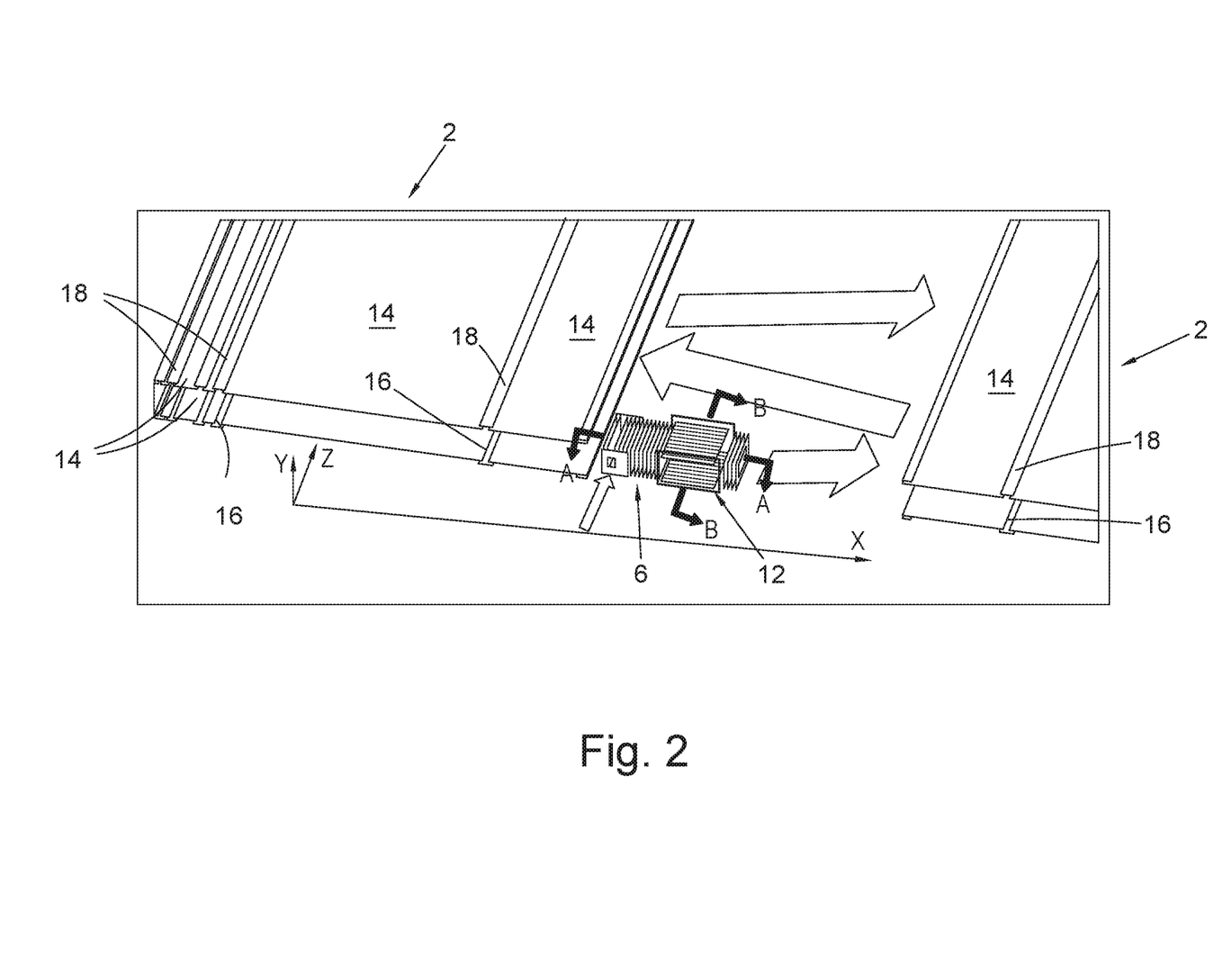
FIG. 2 shows a perspective view of a portion of an MRTOF mass analyzer according to an embodiment of the present invention.

FIG. 2 shows a schematic illustration of part of an MRTOF mass analyzer of the type shown in FIGS. 1A-1B and according to an embodiment of the present invention. Portions of the ion mirrors 2 are shown with the orthogonal accelerator 6 and deflector 12 arranged therebetween. As shown by the arrows, in use, ions are delivered to the orthogonal ion accelerator 6 and are orthogonally ejected therefrom into one of the ion mirrors 2. The ions are then reflected between the ion mirrors multiple times, as described above in relation to FIGS. 1A-1B.

In order to reflect the ions in the X-dimension, each ion mirror 2 comprises a plurality of electrodes 14 that are spaced apart in the X-dimension and which are elongated in the Z-dimension. Different voltages are applied to the different electrodes so as to generate an electric field within the ion mirror for reflecting the ions. As can be seen from FIG. 2, slotted gaps 16 are provided between adjacent electrodes 14 of the ion mirror 2. These slotted gaps 16 are open and are not filled with any solid material. For example, an electrically insulating material is not present in these gaps 16. An electrically conductive layer 18 is arranged on the outer side of the ion mirror 2 at a location coinciding with (and overlaying) each gap 16 so as to cover the gap 16. A separate layer may be provided for each gap 16, as shown, or a single layer may be provided to cover multiple gaps or all gaps. Each layer 18 may prevent or inhibit electric fields passing through the gap(s) 16 that it covers so as to prevent or inhibit such fields entering the ion mirror 2. The layer 18 may be spaced apart in the Y-dimension from the electrodes 14 or may be directly adjacent to it. Additionally, or alternatively, the layer 18 may be a coating of conductive material on the surface of a substrate that faces the electrodes 14, the coating being at least in the regions coinciding with the gaps 16. For example, the layer 18 may be a conductive pattern formed on an electrically insulating substrate (in other words, formed by a PCB). The conductive layer coinciding with any given gap may be grounded or another electrical potential applied thereto, such as a potential intermediate the potentials of the electrodes on either side of the gap. This prevents charge building up on the layer and affecting the electric field inside the ion mirror.

The electrodes 14 may be formed by sheet metal electrodes, plate metal electrodes or PCBs. Additionally, or alternatively, the layer(s) 18 may be may be formed by sheet metal electrodes, plate metal electrodes or PCBs. In embodiments where the layer(s) 18 are in direct contact with the electrodes 14 that form the inner surface of the ion mirror 2, and in which the layer(s) are electrically conductive on the inner surface, the layer(s) 18 are electrically insulated from the electrodes 14 that form the inner surface.

Embodiments are contemplated wherein both the electrodes that form the inner surface of the ion mirror and the layer(s) covering the gaps are formed from a composite layered PCB structure.

Figure 3A:
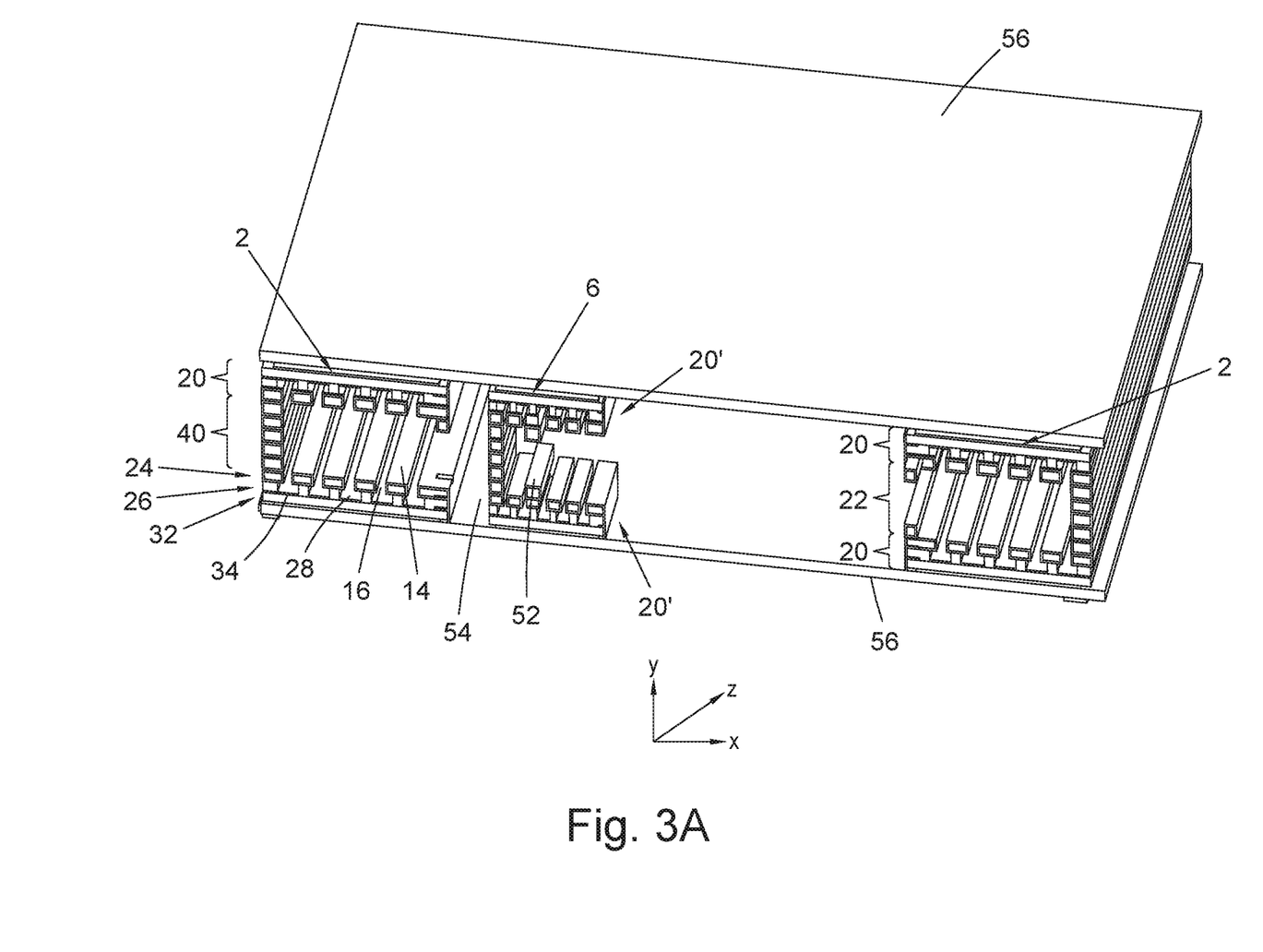
FIG. 3A shows a section through an embodiment of an MRTOF mass analyzer, illustrating the structure of the ion mirrors and orthogonal accelerator.

FIG. 3A shows a section through an embodiment of an MRTOF mass analyzer, which illustrates part of the structure of the ion mirrors 2 and the orthogonal accelerator 6. Each ion mirror 2 comprises two multi-layered PCB assemblies 20 that are each arranged in the X-Z plane and that are spaced apart in the Y-dimension so as to define an ion receiving region therebetween for reflecting ions. Each assembly 20 comprises a plurality of electrodes 14 that are each elongated in the Z-direction and that are spaced apart in the X-direction by gaps 16 between the electrodes. Voltages are applied to these electrodes for reflecting ions in the ion mirror. The structure of each assembly will be described in more detail below in relation to FIGS. 3B-3C. Each ion mirror 2 may also comprise an end cap 22 at the X-dimensional end of the ion mirror at which the ions are turned around, and may comprise side walls at the Z-dimensional ends of the ion mirror (not shown). These structures may be formed by a stack of PCBs, sheet metal electrodes or plate metal electrodes, as will be described below.

Figure 3B:
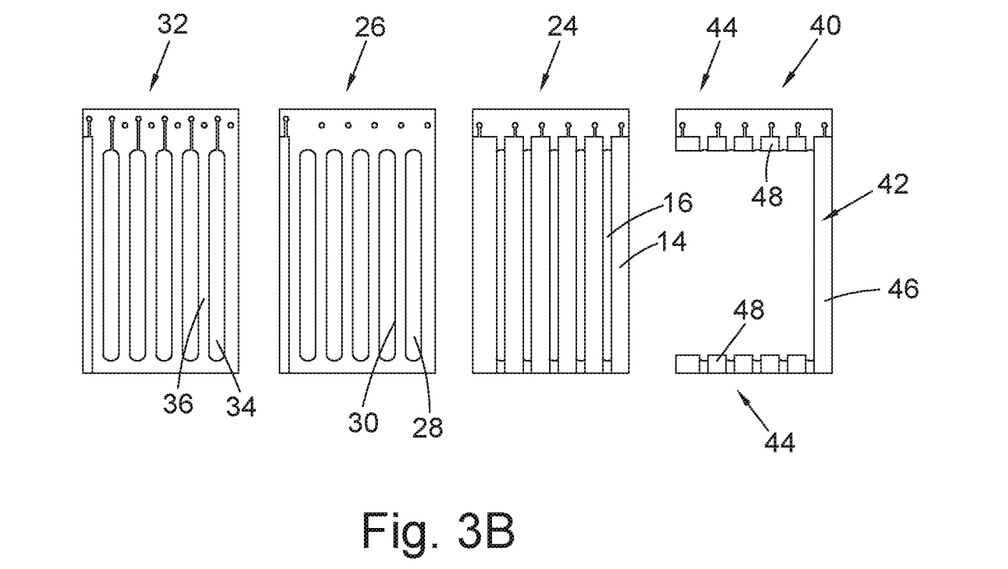
FIG. 3B shows four different types of layer for forming each ion mirror.
Figure 3C:
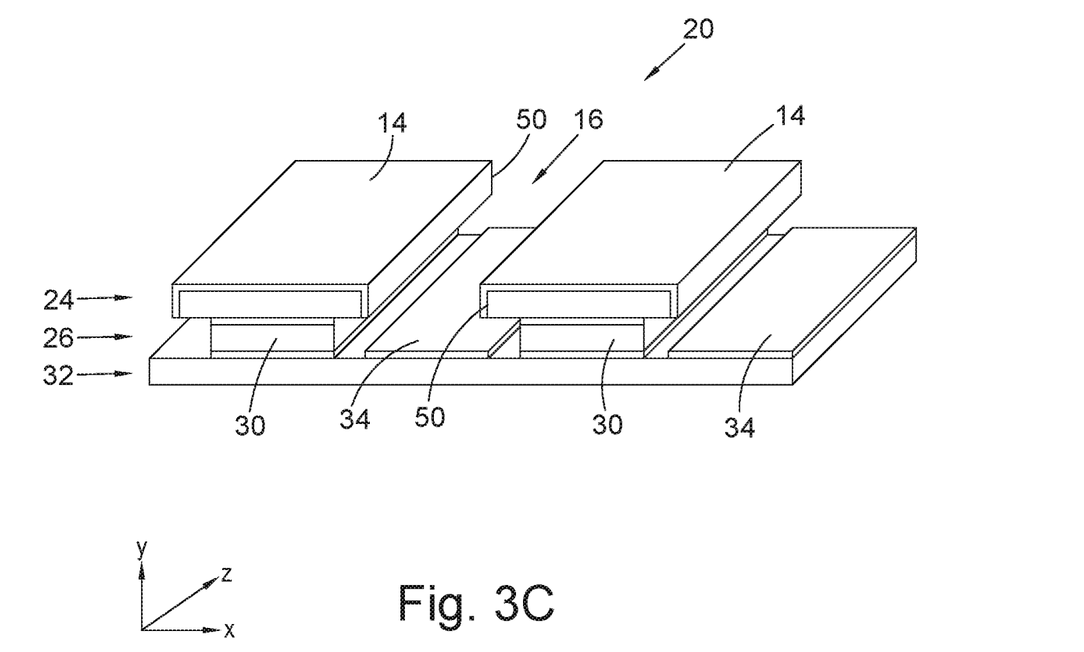
FIG. 3C shows a portion of the ion mirror structure.

FIG. 3B shows four different types of PCB sheets for forming the ion mirror shown on the right side (in the X-dimension) of FIG. 3A. As described above, each of the ion mirrors comprises two PCB assemblies 20 that are each arranged in the X-Z plane. Each PCB assembly comprises a first PCB sheet 24 at the inner surface of the ion mirror 2. This first PCB sheet 24 comprises the above-described plurality of different electrodes 14. The portions of the insulating substrate of the first PCB sheet 24 between the electrodes have been removed so as to form slotted gaps 16 between the electrodes 14 that extend through the first PCB sheet 24. A second PCB sheet 26 is arranged against the outer surface of the first PCB sheet 24. The second PCB sheet 26 has a plurality of slotted gaps 28 arranged therein that are spaced apart in the X-dimension and separated by ribs 30 of the PCB, such as ribs of the insulating substrate. The majority (or all) of the second PCB sheet 26, or at least the ribs 30 thereof, may not be coated with electrically conductive material. The second PCB sheet 26 acts as a spacer layer and is arranged against the outer side of the first PCB sheet 24 such that the slotted gaps 28 of the second PCB sheet 26 are coincident with the slotted gaps 16 in the first PCB sheet 24, and the ribs 30 of the second PCB sheet 26 are against the portions of the first PCB sheet 24 on which the electrodes 14 are located. A third PCB sheet 32 is arranged against the outer surface of the second PCB sheet 26. The third PCB sheet 32 has a plurality of different electrodes 34 arranged thereon (which may correspond to layer 18 in previous embodiments) that are spaced apart in the X-dimension and separated by insulating substrate 36 between the electrodes 34. The third PCB sheet 32 is arranged against the second PCB sheet 26 such that the slotted gaps 28 of the second PCB sheet are coincident with the electrodes 34 of the third PCB sheet 32, and the ribs 30 of the second PCB sheet 26 may be against insulating substrate portions 36 of the third PCB sheet 32. In other words, in the X-Z plane, the electrodes 34 of the third PCB sheet 32 are arranged within the gaps 16 in the first PCB sheet 24. A portion of the PCB assembly 20 is shown in FIG. 3C.

It is also contemplated that additional PCB sheets could be provided between the first and third PCB sheets 24, 32 so as to increase the spacing between the electrodes 14 and electrodes 34. Alternatively, it is contemplated that the second PCB sheet 26 may be omitted, although it must still be ensured that the electrodes 14 on the first PCB sheet 24 are arranged so as to be electrically isolated from any electrodes 34 on the third PCB sheet 32.

FIG. 3B also illustrates a fourth type of PCB 40, a plurality of which may be stacked together and arranged between opposing PCB assemblies 20 in each ion mirror 2, thereby forming the end cap 22 and Z-dimension side walls of the ion mirror 2. This is shown in FIG. 3A, except that this sectional view does not show the Z-dimensional side walls of the ion mirror. This fourth PCB type 40 corresponds to the first PCB type 24, except that its central portion and one of the X-dimensional side walls are not present. The fourth PCB type 40 consists of a first elongated strip portion 42 for forming the end cap wall 22 of the ion mirror and an orthogonally arranged elongated strip portion 44 at either longitudinal end of the first elongated strip portion 42, for forming the Z-dimensional side walls of the ion mirror. In other words, the fourth PCB 40 is substantially C-shaped. The first elongated strip portion 42 comprises an electrode 46 arranged on the insulating substrate, to which the end cap voltage may be applied. Each of the orthogonally arranged elongated strip portions 44 has a plurality of electrodes 48 arranged thereon that are spaced apart in the X-dimension and separated by insulating substrate between the electrodes. These electrodes 48 may be arranged such that when the fourth PCBs 40 are located in the ion mirror, these electrodes are at the same locations (in the X-dimension) as the electrodes 14 on the first PCB 24. The voltage applied to any given one of the electrodes 48 on the fourth PCB40 may be the same as the voltage applied to the electrode 14 on the first PCB 24 at the same location in the X-dimension.

It will be appreciated that mirror images of the PCB layers shown in FIG. 3B are used to form the ion mirror shown on the left side (in the X-dimension) of FIG. 3A.

In use, various different voltages are applied to the electrodes of the first PCB 24 and fourth PCB 40 of the ion mirror to generate an electric field for reflecting ions in the ion mirror. As gaps 16 are provided between the electrodes 14 on the first PCB, any ions (or other charged particles) that are scattered towards the first PCB either impact on the electrodes 14 or pass through the gaps 16 between the electrodes. As such, unwanted electrical charge is unable to build up on the inner surface of the first PCB 24. The third PCB 32, that is located outwardly of the first PCB 24, overlays and covers the gaps 16 in the first PCB. This third PCB 32 may be configured to prevent electric fields from passing from the outside of the ion mirror 2 to the inside of the ion mirror, through the gaps 16 in the first PCB 24. For example, the third PCB 32 may have electrical conductors/electrodes 34 arranged at locations that coincide (in the X-Z plane) with the gaps 16 in the first PCB 24. Electric potentials may be applied to these electrodes 34 on the third PCB 32. For example, the potential applied to any given electrode 34 on the third PCB 32 may be between the two potentials applied to the two respective electrodes 34 on opposite sides of the gap 16 with which that electrode on the third PCB is coincident. For example, the potential applied to any given electrode on the third PCB may be substantially midway between the two potentials applied to the two electrodes on opposite sides of the gap with which that electrode on the third PCB is coincident. This may reduce the impact on the electric fields within the ion mirror that are generated by the electrodes on the first PCB layer.

It is advantageous to minimize the exposure of the PCB insulating substrate to scattered ions. For this purpose, the electrodes 14 of the first PCB 24 may extend down the edge walls 50 of the gaps 16 in the first PCB 24 (as shown in FIG. 3C). Alternatively, the edges may be cut such that the walls 50 of the gaps are not orthogonal to the inner surface of the first layer, but are instead angled such that the edge walls 50 are hidden below the first layer.

The second PCB 26 enables the third PCB 32 to be spaced apart from the first PCB 24. As electrodes 14 of the first PCB 24 may extend down the edge walls 50 of the gaps 16 in the first PCB 24 (as shown in FIG. 3C), the use of the second PCB 26 enables the electrodes 34 on the third PCB 32 to be spaced apart and therefore electrically isolated from the first electrodes 14 (particularly at the edges 50 of the gaps 16). The second PCB 26 may have substantially no conductive material thereon and may be substantially only an insulating substrate sheet.

In alternative embodiments to those described above, rather than providing a second PCB sheet 26, a sheet other than a PCB may be used or individual spacer members may be used to space the first and third PCBs 24 and 32) apart.

FIG. 3A also shows an embodiment of the structure of the gridless orthogonal accelerator 6. The orthogonal accelerator comprises two PCB assemblies 20' that are each arranged in the X-Z plane and that are spaced apart in the Y-dimension so as to define an ion receiving region therebetween. Each assembly 20' comprises a plurality of electrodes that are each elongated in the Z-direction and that are spaced apart in the X-direction by gaps between the electrodes. Voltages are applied to these electrodes for accelerating ions into one of the ion mirrors. The structure of each PCB assembly may be formed in the same manner as the PCB assemblies in the ion mirror. An additional PCB layer 52 may be provided on part of the inner surface of each first PCB sheet so as to provide a restricted aperture in the Y-Z plane through which the ions are pulsed. The orthogonal accelerator 6 also comprises a pushing electrode wall 54 at the X-dimensional end from which the ions are pulsed, and may also comprises Z-dimensional side walls (not shown). These may be formed using the fourth type of PCB 40 shown in FIG. 3B, in the same way that the end cap 22 and side walls of the ion mirror 2 are formed. Alternatively, these may be formed by sheet metal electrodes or plate metal electrodes.

In use, various different voltages are applied to the electrodes at the inner surfaces of the orthogonal accelerator to generate an electric field that orthogonally accelerates ions entering the orthogonal accelerator.

As shown in FIG. 3A, it is contemplated that rigid walls 56 of the housing of the mass analyzer may be used to provide flatness and precise positioning of the PCB electrodes. The ion mirror PCB assemblies 20 and orthogonal accelerator 6 may therefore be fully formed by PCB assemblies that are sandwiched between the rigid walls 56. Optionally, the ion mirror PCB assemblies 20 and orthogonal accelerator 6 may be sandwiched between further PCB sheets (not shown), which themselves are sandwiched between the rigid walls 56.

As described above, it is contemplated that conventional electrodes may be used in combination with the PCB electrode assemblies, particularly for example where good flatness of surfaces is needed in a direction orthogonal or inclined to the PCB layered surfaces. For example, a conventional metal sheet or metal plate electrode may be used for the ion mirror end cap, each ion mirror side wall, the orthogonal accelerator pushing electrode wall, or for other electrodes of the orthogonal accelerator. These electrodes may be soldered or otherwise secured between the opposing PCB assemblies, optionally being jigged before being secured in place. These conventional electrodes may serve as spacers between the PCB electrode assemblies.

FIG. 2 shows an example of an orthogonal accelerator 6 having a combination of conventional metal sheet or metal plate electrodes for orthogonally accelerating the ions, and PCB electrodes for deflecting the ions in the Z-dimension. The conventional electrodes may be soldered or otherwise secured between the PCB layers.

Figure 4:
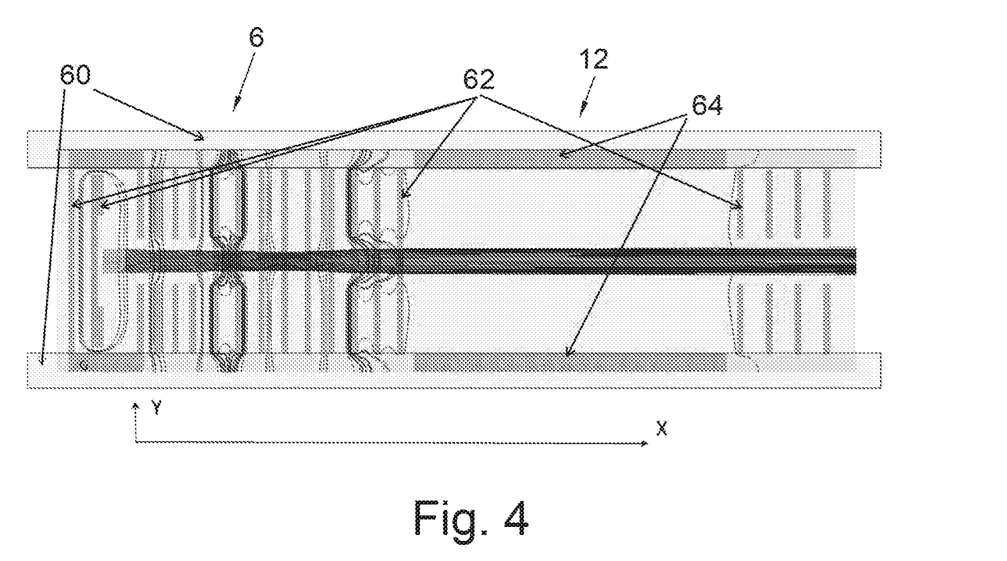
FIG. 4 shows a Simion® plot of an embodiment of the orthogonal accelerator and deflector shown in FIG. 2.

FIG. 4 shows a Simion® plot of an embodiment of the orthogonal accelerator 6 and deflector 12 shown in FIG. 2, illustrating the electric potentials and ion trajectories of the ions. FIG. 4 corresponds to the cross-sectional view illustrated as view A in FIG. 2. The orthogonal accelerator 6 may comprise opposing PCB sheets 60 that are spaced apart in the Y-dimension and a plurality of electrodes 62 that extend in the Y-Z plane arranged therebetween. Some or all of the electrodes 62 arranged in the Y-Z plane may be sheet metal or plate metal electrodes that are secured to the PCB sheets 60, for example by soldering. Voltages may be applied to these electrodes 62 so as to control the motion of the ions in the X-dimension. As described in relation to FIG. 1B, an ion deflector 12 may also be provided for deflecting ions in the Z-dimension. This deflector 12 may comprise electrodes 64 of the PCB sheets 60, i.e. electrodes deposited on the PCB substrate.

Figure 5:
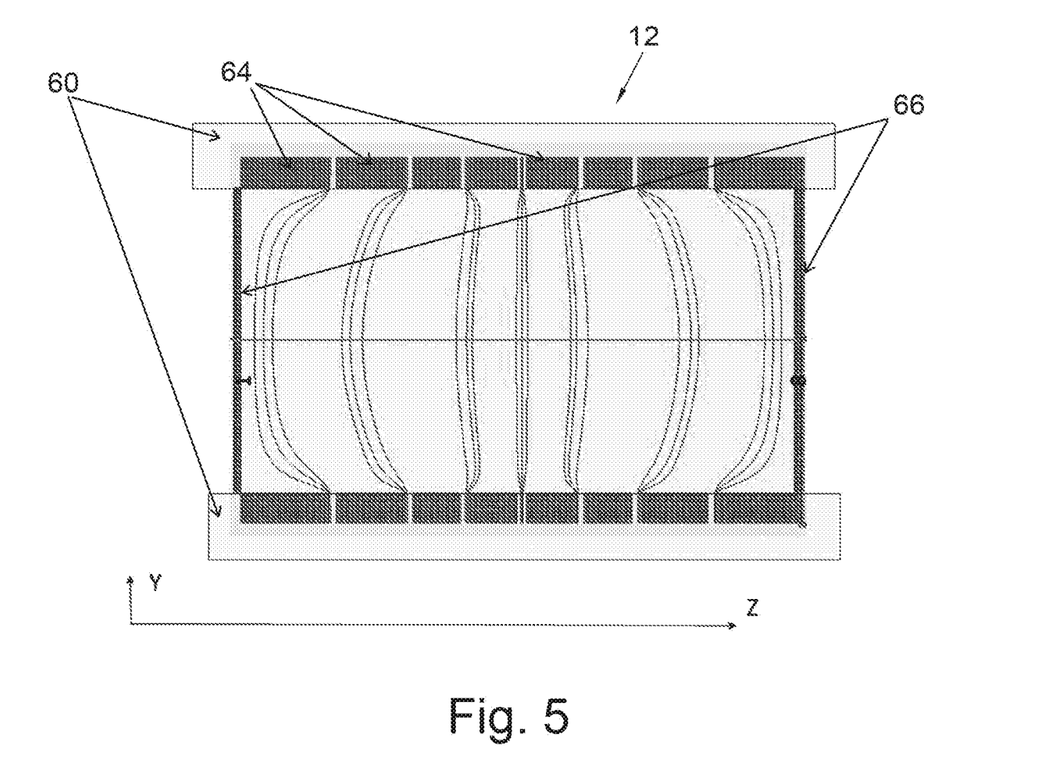
FIG. 5 shows a Simion® plot of the ion deflector 12 in the cross-sectional view illustrated as view B in FIG. 2.

FIG. 5 shows a Simion® plot of the ion deflector 12 in the cross-sectional view illustrated as view B in FIG. 2. The electric potentials within the ion deflector are illustrated. As can be seen from this view, the deflector 12 may comprise a plurality of electrodes 64 spaced apart in the Z-dimension along each PCB sheet 60. Different voltages may be applied to different electrodes 64 as a function of their location in the Z-dimension so as to generate a nearly homogeneous electric field that substantially evenly deflects ions in the Z-dimension. The deflector 12 may comprise opposing side wall electrodes 66 arranged in the X-Y plane. These electrodes 66 may be plate metal or sheet metal electrodes and may be secured to and between the PCB sheets 60, for example, by soldering.

It is contemplated that at least the deflector electrodes 64 that are spaced in the Z-dimension may comprise opposing PCB assemblies with the layers of thin electrodes of the type described above in relation to the ion mirrors.

Figure 6:
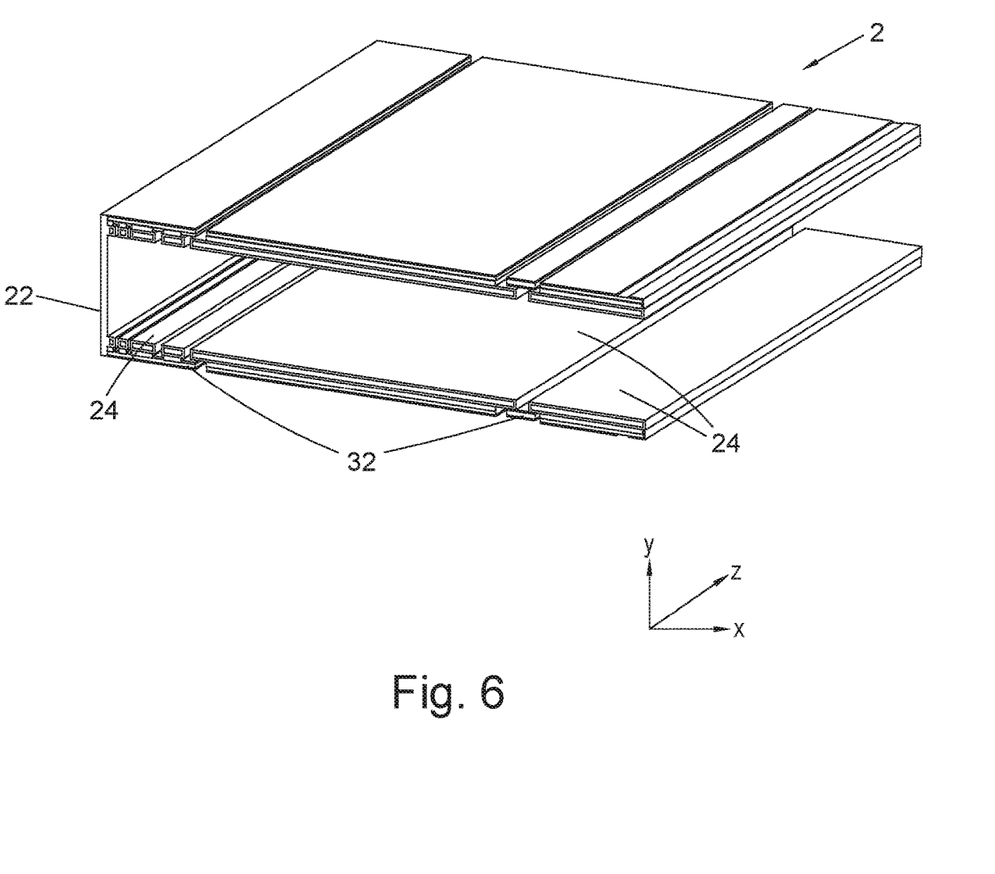
FIG. 6 shows another embodiment of an ion mirror.

FIG. 6 shows another embodiment of an ion mirror 2, with a fine electrode structure in the region where ions are turned around, without the Z-dimensional side walls being illustrated. As in some of the previously described embodiments, the ion mirror may comprise two PCB assemblies that are each arranged in the X-Z plane and that are spaced apart in the Y-dimension so as to define an ion receiving region therebetween. The end cap electrode 22 may be formed by sheet metal, plate metal, or orthogonally mounted metal-plated board (such as a PCB). The end cap electrode 22 may be soldered between or to the ends of the PCB assemblies. The external surfaces of the PCB assemblies may be electrically grounded for their safe mounting between the rigid support walls 56 (shown in FIG. 3A). The slots may be made through the external layers to enable gas to be pumped through the electrode assemblies so as to evacuate the interior of the mass analyzer.

Although the present invention has been described with reference to preferred embodiments, it will be understood by those skilled in the art that various changes in form and detail may be made without departing from the scope of the invention as set forth in the accompanying claims.

For example, although embodiments of an MRTOF mass analyzer have been described in which the ions drift along a linear Z-axis whilst they are reflected between the ion mirrors, it is alternatively contemplated that each ion mirrors may define a cylindrical ion receiving region such that the ions drift in a circumferential direction around the cylindrical mirrors. Such embodiments do not require the Z-dimensional end walls described above.

Although embodiments of ion mirrors, gridless orthogonal accelerators and ion deflectors have been described in relation to ion-optical components for MRTOF mass analyzers, the ion-optical components may be for single reflection TOF mass analyzers. Moreover, the layered structures described herein may be used for electrode structures in other types of ion-optical components to those described herein, such as ion lenses, or for ion-optical components other than those in mass or mobility spectrometers. The layered structures described herein may be used, for example, in any device where a fine/precise electrode structure or electric field is required.

A PCB as used herein may refer to a component comprising electrodes (such as conductive tracks, pads and other features) etched from, printed on, deposited on, or laminated to a non-conductive substrate.

The electrically non-conductive substrates described herein may be sheet or bulk material, or may be 3D-printed or deposited on another substrate by any other method.

The invention claimed is:

1. An electrode assembly comprising:
a first layer comprising a printed circuit board (PCB) having an electrically insulating substrate and a plurality of electrodes arranged on the substrate that are separated by one or more gaps, wherein the substrate has one or more apertures therethrough that are respectively coincident with said one or more gaps;
at least one second layer arranged to cover said one or more gaps and prevent electric fields passing through said one or more gaps, said at least one second layer having electrically conductive material located to be coincident with said one or more gaps in the first layer; and
at least one intermediate layer arranged between the first and second layers for spacing the first layer away from the at least one second layer.

2. The electrode assembly of claim 1, wherein no solid material is provided in the gaps in the first layer.

3. The electrode assembly of claim 1, wherein the plurality of electrodes are elongated electrodes and the gaps are elongated slots.

4. The electrode assembly of claim 1, wherein the electrodes of the first layer extend so as to cover side edges of the apertures in the substrate.

5. The electrode assembly of claim 1, wherein a single said second layer covers multiple gaps, or all gaps, in the first layer.

6. The electrode assembly of claim 1, wherein a separate one of said second layers covers each gap in the first layer.

7. The electrode assembly of claim 1, wherein the at least one second layer comprises a printed circuit board (PCB) having an electrically insulating substrate, wherein said electrically conductive material is deposited on, etched on, printed on, laminated to, or otherwise formed on said substrate.

8. The electrode assembly of claim 1, wherein said second layer is at least one sheet metal or plate metal electrode.

9. The electrode assembly of claim 1, wherein the electrically conductive material is at least on the side of the second layer facing towards the first layer.

10. The electrode assembly of claim 1, wherein the conductive material is electrically grounded or connected to a voltage source so as to be maintained at an electrical potential, in use.

11. The electrode assembly of claim 1, wherein the first layer comprises first and second electrodes on opposite sides of each gap in the first layer and that are connected to voltage sources so as to be maintained at different electrical potentials in use, and wherein the conductive material in the second layer at a location coinciding with that gap is connected to a voltage source so as to be maintained at an electrical potential between said different electrical potentials, in use.

12. The electrode assembly of claim 1, wherein each of the at least one intermediate layers comprises a plurality of apertures therein, wherein each aperture is located to be coincident with both one of the gaps in the first layer and the conductive material on the second layer.

13. An ion-optical element comprising:
a first electrode assembly according to claim 1; and
a second electrode assembly according to claim 1;
wherein the first and second electrode assemblies are spaced apart so as to define an ion receiving region therebetween.

14. The ion-optical element of claim 13, wherein the first layer of the first electrode assembly faces the first layer of the second electrode assembly.

15. The ion-optical element of claim 13, wherein the ion-optical element is an ion mirror comprising voltage supplies connected to the plurality of electrodes in each of the first and second electrode assemblies for applying different voltages to these electrode for reflecting ions within the ion mirror; or
wherein the ion-optical element is an ion lens, ion deflector, ion reflector, ion accelerator, orthogonal ion accelerator or ion detector.

16. The ion-optical element of claim 13, comprising one or more metal electrode extending between and/or joined to the first and second electrode assemblies.

17. A Time of Flight (TOF) mass analyser, multi-reflecting TOF mass analyser, electrostatic trap, mass spectrometer or mobility spectrometer comprising an electrode assembly as claimed in claim 1.

* * * * *